United States Patent
Smathers et al.

(10) Patent No.: US 6,774,339 B1
(45) Date of Patent: Aug. 10, 2004

(54) HERMETIC SEALING OF TARGET/ BACKING PLATE ASSEMBLIES USING ELECTRON BEAM MELTED INDIUM OR TIN

(75) Inventors: David B. Smathers, Columbus, OH (US); Dorian Heimanson, Foster City, CA (US); Michael Gutkin, Goleta, CA (US)

(73) Assignee: Tosoh SMD, Inc., Grove City, OH (US)

( * ) Notice: Subject to any disclaimer, the term of this patent is extended or adjusted under 35 U.S.C. 154(b) by 19 days.

(21) Appl. No.: 10/129,585
(22) PCT Filed: Nov. 9, 2000
(86) PCT No.: PCT/US00/31037
§ 371 (c)(1), (2), (4) Date: Aug. 19, 2002
(87) PCT Pub. No.: WO01/34339
PCT Pub. Date: May 17, 2001

Related U.S. Application Data
(60) Provisional application No. 60/164,423, filed on Nov. 9, 1999.

(51) Int. Cl.[7] .......................... B23K 1/005; B23K 33/00; B23K 15/04
(52) U.S. Cl. .............................. 219/121.66; 219/121.17; 219/121.22; 219/121.35; 228/124.6; 228/122.1; 228/165; 228/245
(58) Field of Search .......................... 219/121.6, 121.13, 219/121.63–121.66, 121.2, 121.16–121.17, 121.21–121.22, 121.35; 228/245–246, 254, 248.1, 249–250, 124.6, 122.1, 121, 165, 166–174

(56) References Cited

U.S. PATENT DOCUMENTS

| | | | | |
|---|---|---|---|---|
| 4,341,816 A | * | 7/1982 | Lauterbach et al. | 427/456 |
| 4,476,151 A | | 10/1984 | Keller et al. | |
| 5,009,765 A | * | 4/1991 | Qamar et al. | 204/298.12 |
| 5,230,459 A | * | 7/1993 | Mueller et al. | 228/164 |
| 5,230,462 A | | 7/1993 | Vascak et al. | |
| 5,392,981 A | * | 2/1995 | Makowiecki et al. | 228/122.1 |
| 5,522,535 A | * | 6/1996 | Ivanov et al. | 228/122.1 |
| 5,558,751 A | | 9/1996 | Mahler et al. | |
| 5,653,856 A | * | 8/1997 | Ivanov et al. | 204/192.12 |
| 5,836,506 A | | 11/1998 | Hunt et al. | |
| 6,071,389 A | * | 6/2000 | Zhang | 204/298.12 |
| 6,073,830 A | | 6/2000 | Hunt et al. | |
| 6,085,966 A | * | 7/2000 | Shimomuki et al. | 228/193 |
| 6,164,519 A | | 12/2000 | Gilman et al. | |
| 6,199,259 B1 | * | 3/2001 | Demaray et al. | 29/458 |
| 2002/0185521 A1 | * | 12/2002 | Kuriyama et al. | 228/194 |

FOREIGN PATENT DOCUMENTS

| | | | | |
|---|---|---|---|---|
| JP | 63033174 A | * | 2/1988 | |
| JP | 01047864 A | * | 2/1989 | |
| JP | 02043362 A | * | 2/1990 | |
| JP | 04168267 A | * | 6/1992 | |

* cited by examiner

Primary Examiner—Kiley Stoner
Assistant Examiner—Kevin McHenry
(74) Attorney, Agent, or Firm—Wegman, Hessler & Vanderburg

(57) ABSTRACT

The interfacial joint area of a target/backing plate assembly is sealed so as to inhibit the migration of air and/or water vapor that may be present or trapped along the interfacial surfaces. A pool or bead of molten solder is placed along the interfacial joint and moved continuously around the full 360° circumference of the assembly so as to cover and seal the boundary area. The solder is melted, preferably, by e-beam welding in a vacuum or the like.

17 Claims, 6 Drawing Sheets

HERMETIC SEALING OF TARGET/BACKING PLATE ASSEMBLIES USING ELECTRON BEAM MELTED INDIUM OR TIN

CROSS-REFERENCE TO RELATED APPLICATIONS

Priority filing benefit of (1) International PCT application PCT/US00/31037 filed Nov. 9, 2000, and published under PCT 21(2) in the English language: (2) U.S. Provisional Application Serial No. 60/164,423 filed Nov. 9, 1999.

BACKGROUND OF THE INVENTION

1. Field of the Invention

The present invention pertains to the formation of a hermetic sealing joint along the target and backing interface by the provision of melted solder around the interfacial area.

2. Prior Art

A customer driven need has been identified to reduce the impact of virtual leaks from solder bonded assemblies on vacuum quality in their sputtering system. The goal is to cut the bond line off from the vacuum by a coherent, fully dense metal seal.

Solder bonding is generally done using either a tin eutectic alloy (such as tin 3.5 weight percent silver) or pure indium. The bonding process is performed in air or under a protective atmosphere, and a solder flux may be used to break oxide barriers on the metal being bonded. Bonding in air or under a protective atmosphere can lead to trapped pockets containing gas. It is possible for porosity within the bond layer to allow the trapped gas to escape over at a low leak rate from the bond line between the target and the backing plate.

The most common approach to eliminate virtual leakage from a solder bond is to eliminate the solder bond entirely. This can be done several ways. The most simple is to make the target/backing plate a monolithic assembly, i.e., one piece. The second method is to diffusion bond the target to the backing plate. Diffusion bonding is performed under high pressure and temperature, and a vacuum exists inside the diffusion bonding assembly prior to the application of heat and pressure. A third method involves electron beam welding of the target to the backing plate. Electron beam welding works if the joint between the target and backing plate is ductile. It is not possible to directly weld aluminum to copper.

It is not practical to solder bond in a vacuum. Thus, trapped pockets of gas are inevitable in a solder bond.

A monolithic assembly is possible when the economic value of the material is not too high, and the target material is sufficiently strong and ductile to bear the structural demands of the backing plate. Deflection can be a problem if the target alloy is not very strong. Some materials are also brittle. Some backing plate designs involve internal cooling channels, and this is the case with one current CVC commercial design. A monolithic assembly would involve redesigning the target/backing plate to a two-piece setup with channels cut in the back of the monolithic piece (similar to the Ulvac ZX-1000).

Diffusion bonding is commonly conducted at temperatures between 300° and 6000° C. This can be detrimental to the microstructure of some materials and also will leave residual stress in the assembly if the thermal expansion coefficients of the target and backing plate are different. Brittle target materials are difficult to diffusion bond because of the bending moment and stress caused by the differential thermal expansion and the application of pressure at high temperature. Not all materials can be diffusion bonded to copper, aluminum or molybdenum, the most common backing plate materials. The same issue regarding internal cooling channels exists for diffusion bonded targets.

Electron beam welding the target to the backing plate is possible only if the backing plate and target materials will form a ductile alloy.

SUMMARY OF THE INVENTION

In accordance with the invention, a solder material such as pure tin or indium is used to hermetically seal the circumferential joint or interface formed between a cylindrical target and a generally cylindrical backing plate.

The invention can be summarized by the following steps:

1) Solder Bond target to backing plate using conventional bonding practice;
2) Clean excess solder from the backing plate/target assembly;
3) Optionally, place a shim of the sealing material (In or Sn) at the target/backing plate interface;
4) Use an Electron Beam welder (low power in vacuum) and run a molten bead around the target/backing plate interface until at least one complete revolution is made. This target will be on a rotating platter of some kind.
5) A laser may be substituted for the electron beam. A focused energy beam may be used to excite the solder bond without disturbing the solder backing plate or moving the target structure away from the controlled spot. IDX biggest concern for a laser system would be a lack of vacuum to avoid trapped gas in the weld region.

The indium metal (or tin) will wet the surface of the backing plate and the target, and the molten pool will solidify 100% dense because of the speed and vacuum. The welded bead will seal off the bond line and permanently close off the trapped gas areas between the target and backing plate.

Indium may be preferable to tin because of its tendency to wet most materials. Indium wetting may be enhanced by rubbing pure indium against the area to be coated.

This method is different from electron beam welding the target to the backing plate because the target material and the backing plate material do not alloy together. There maybe a very small region at the indium (or tin) metal interfaces form intermetallics which are no different than if the indium or tin had been soldered to those surfaces in the traditional manner. In addition, the target may be removed by simply heating the assembly above the melting point of the solder, and the backing plate can be used again.

Electron beam welding is suggested here because a vacuum is required to operate the welder. Making the hermetic seal in a vacuum environment will reduce the chances of porosity impacting the quality of the seal. Trapped gas may cause an eruption which could compromise the seal.

TIG welding may also work to make this seal. However, there is a higher probability of trapped gas causing bubbles in the seal with TIG welding.

The invention provides advantage since the same technology can be used on other backing plate assemblies besides the current customer design, and because more materials can be bonded together with no virtual leak. The grain structure of the target can also be preserved, and the basic backing plate construction does not have to be modified to achieve the desired result. Backing plates with internal cooling channels can also be used.

It is thought that the following features are new:
1) Modifying the backing plate/target dimensions to promote a hermetic seal with an electron beam welder;
2) Ignoring the content of the majority of the bond area and focusing only on the edge; and
3) Use of an electron beam welder in vacuum to run a solder bead for bonding targets and backing plates.

In one embodiment, an internal reservoir is made by machining a trough in the backing plate near the outer edge of the target. After bonding, the e-beam will be is used to heat the outer edge of the target zone until the solder starts to melt. The trough allows a solder to flow from both sides to fill the zone. While this may cause some undercutting at the very edge of the target, there will be no opening into trapped pockets under the target.

The trough may, for instance be in the form of a groove with an outer diameter of 11.80" and about a 5° taper to a depth of a 0.020". The tolerance should not be too tight on the taper or the depth as it will be to measure or repeat uses. Between uses, the trough can be prior to the next bonding attempt. It has been found that there is more advantage when the size of the trough is about 2× to 10× thicker than the average bond line thickness. It is possible that the groove positioned at the outer diameter of the target acts as a sink for the solder and might by itself improve the solidification process to reduce the tendency for edge voids to extend into the bond line and subsequently act as virtual leaks.

By way of example, a commercially available CVC style backing plate design will be used for a soldering experiment. The vacuum quality of the result cannot be checked, The experiment will be done with a 100% dense target in order to prevent distortion during the bonding process. A 99.99% pure copper target fits this requirement.

It may be worth considering that the copper backing plate is coated with nickel or nickel-vanadium (non-magnetic) to prevent significant alloying of the solder with the backing plate. This would be a phase II modification after we investigate the closure of the gap by the e-beam for vacuum tightness.

A backing plate (31950) was bonded to a 6N copper target, (lot 8V3669-102) using indium solder. The backing plate was modified according to the plan described above.

After bonding, the target was scanned for voids.

After scanning, the target was placed in a fixture in the electron beam welder to allow the target to be spun around its axis so that the electron beam could be scanned over the target/backing plate interface.

Photographic image results suggest that there is more impact from the shape of the groove than from the welding process. However, this was the first attempt at groove design and the welding process.

The process of bonding followed by electron beam melting of the solder at the target/backing plate interface is feasible and no adverse impact is observed.

It is possible that the groove positioned at the outer diameter of the target acts as a sink for the solder and might by itself improve the solidification process to reduce the tendency for edge voids to extend into the bond line and subsequently act as virtual leaks.

When copper backing plates are employed, it may be beneficial to coat the copper backing plate with nickel or nickel-vanadium (non-magnetic) to prevent significant alloying of the solder with the backing plate.

The invention will be further disclosed in the following detailed description which is to be read in conjunction with the appended drawings.

DETAILED DESCRIPTION OF THE PREFERRED EMBODIMENT

Figure 1:
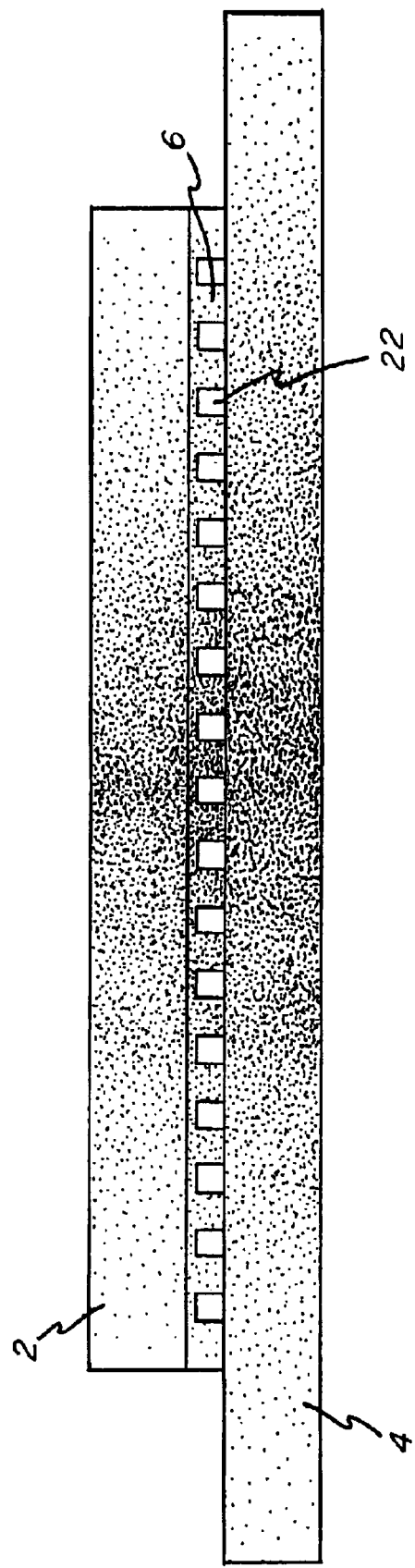
FIG. 1 is a schematic, transverse cross-sectional view of a prior art target and backing plate assembly.

Turning first to FIG. 1, there is shown a prior art target/backing plate assembly that is solder bonded together. Here, the target and backing plate, as shown, are generally circular, with the diameter of the backing plate being larger than the diameter of the target. The target 2 is bonded to the backing plate 4 by solder 6 such as tin or indium. Here, air or water vapor pockets shown at 22 are trapped between the target and backing plate. During the high vacuum conditions that exist in the sputtering process, this air or water vapor can escape from the bonding area and interfere with the desired precision of the sputtering process.

Figure 2:
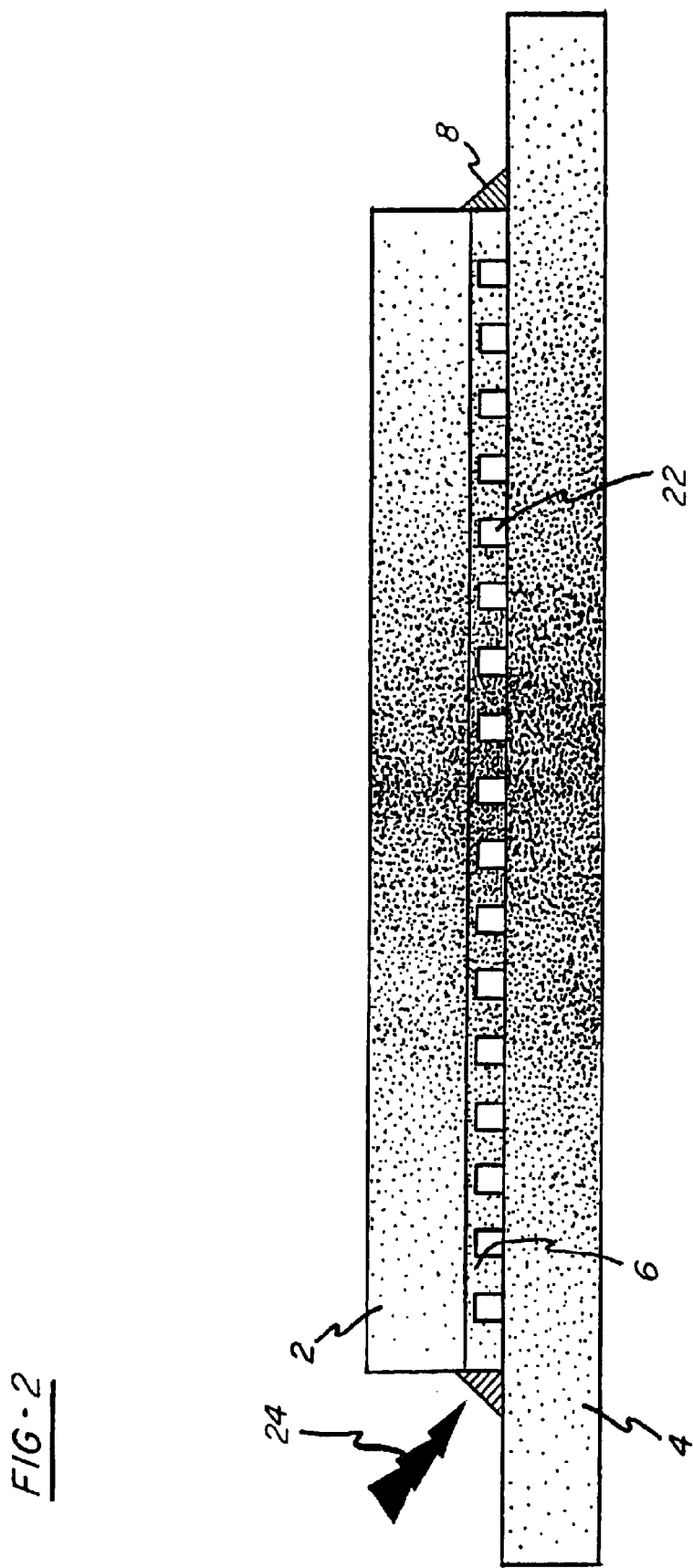
FIG. 2 is a schematic transverse cross-sectional view of a target/backing plate assembly, sealed in accordance with the invention.

In accordance with the invention, and as shown in FIG. 2, a target/backing plate assembly is shown wherein the circumferential interfacial joint formed between the target and the top surface of the backing plate is hermetically sealed by the provision of a solder bead 8 that extends all around the joint. In this regard, due to the hermetic sealing of the peripheral edge of the target/backing plate interfacial area, air and/or water vapors 22 that are trapped between the target and backing plate are inhibited from leaking out into the sputtering environment.

It is noted that the solder bead 8 that is formed around the interfacial surfaces may be placed in the position shown in the form of a shim, such as in rope or tape-like form. Alternatively, the bead of solder 8 can be formed from excess solder present during the solder bonding of the target to the backing plate and in which excess solder is used to initially solder bond the target 2 to the backing plate 4.

Figure 3:
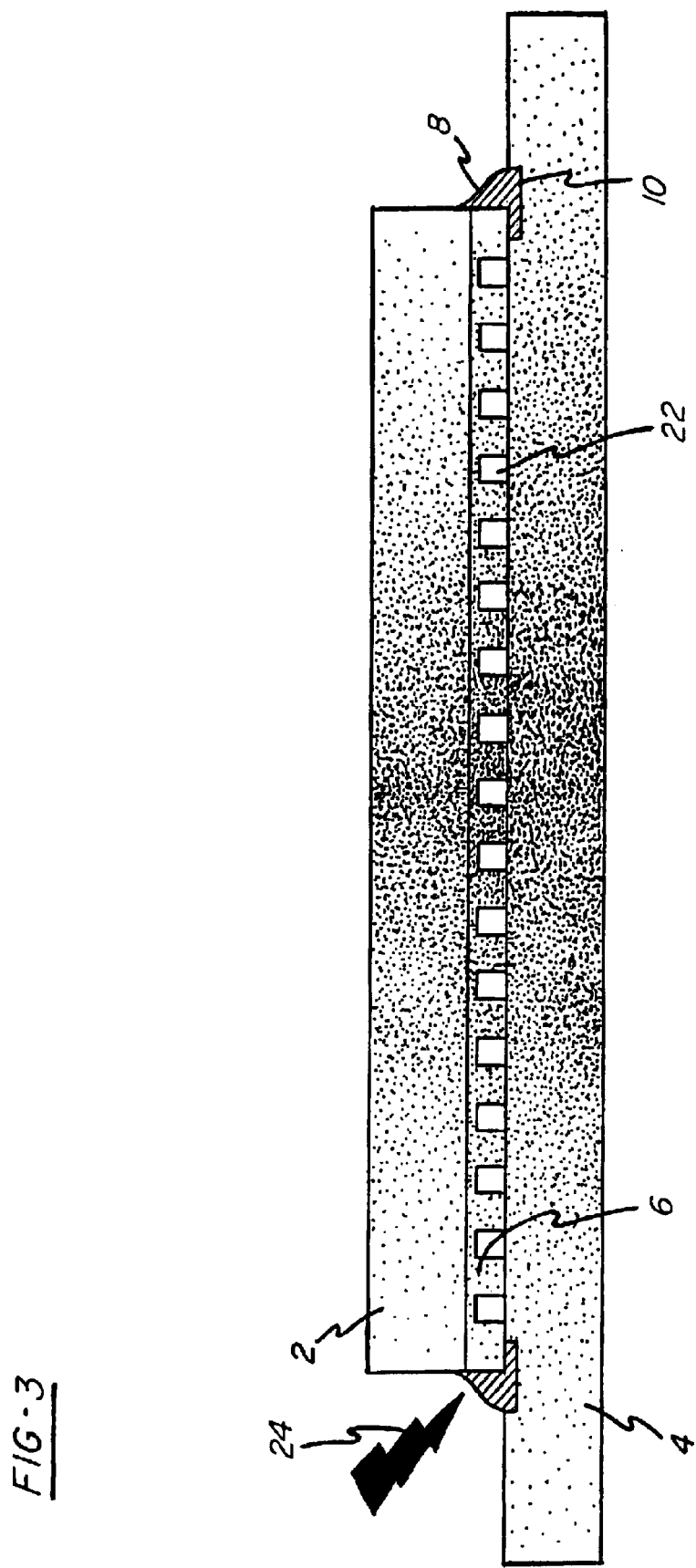
FIG. 3 is a schematic, transverse cross-sectional view of another embodiment of a target/backing plate assembly sealed in accordance with the invention.
Figure 4:
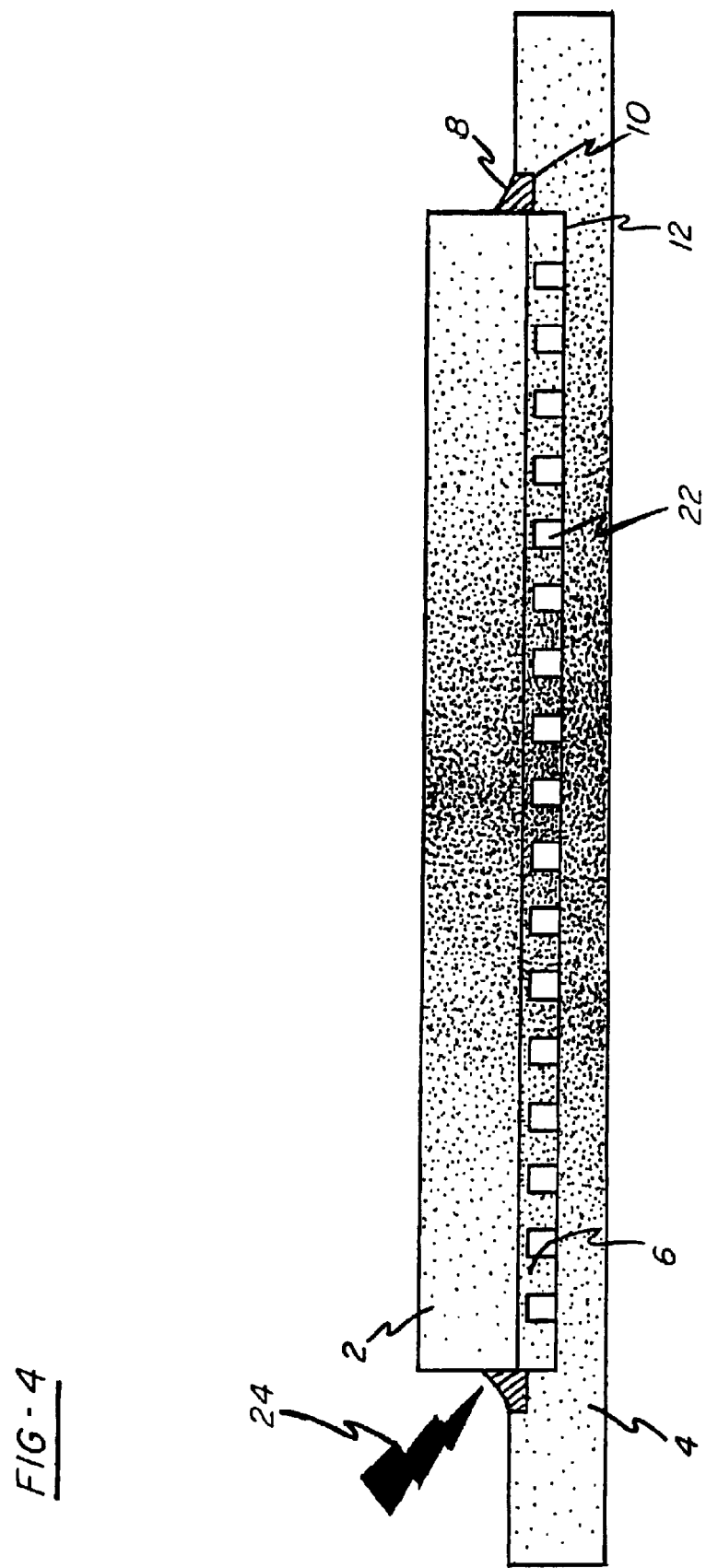
FIG. 4 is a schematic, transverse cross-sectional view of yet another embodiment of a target/backing plate assembly, sealed in accordance with the invention.

In some instances, and as shown in FIG. 3, it is desirable to form a circular recess 10 such as that shown in FIG. 3 that extends around the periphery of the target on the top surface of the backing plate. This serves as a reservoir for the solder bead 8. Additionally, and as shown in FIG. 4, a second concentric recess 12 can be formed in the backing plate inside of the first recess 10. This second concentric recess 12 is used so that the solder bonded area 6 of the target/backing plate is located beneath the plane defined by the top surface of the backing plate 4.

As shown in FIGS. 2–4, the bead 8 of solder is melted, preferably by an electron beam welding assembly with the e-beam shown diagrammatically at 24. The assembly itself may be rotated during this operation, or the e-beam can be moved around the circumferential interfacial joint so that the entire 360° of the circular joint is filled with the bead 8 to provide a complete seal.

Figure 5:
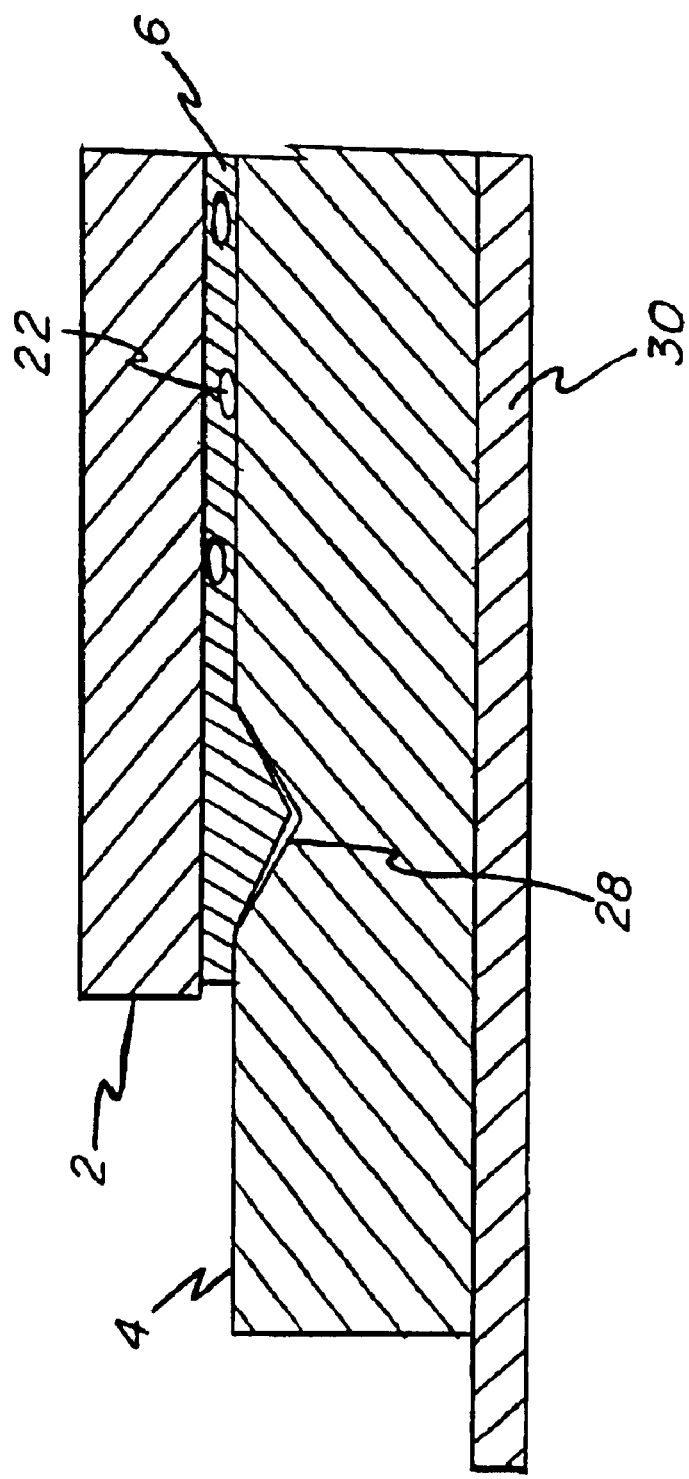
FIG. 5 is a magnified, cross section of a portion of a target/backing plate assembly sealed in accordance with the invention.

Turning to the embodiment shown in FIG. 5, a generally V-shaped trough 28 is provided in the top surface of the backing plate, under the peripheral portion of the target 2. This again serves as a reservoir for the solder bead. As shown in FIG. 5, the assembly is superposed on a mandrel 30 or the like, with the trough facing up, so that it may be rotated.

Optionally, the V-shaped trough can be provided in the bottom surface of the target, near the outer edge of the target. In this case, the target and backing plate would be inverted so that the trough is facing up, then the assembly is superposed on the mandrel as described above.

Figure 6:
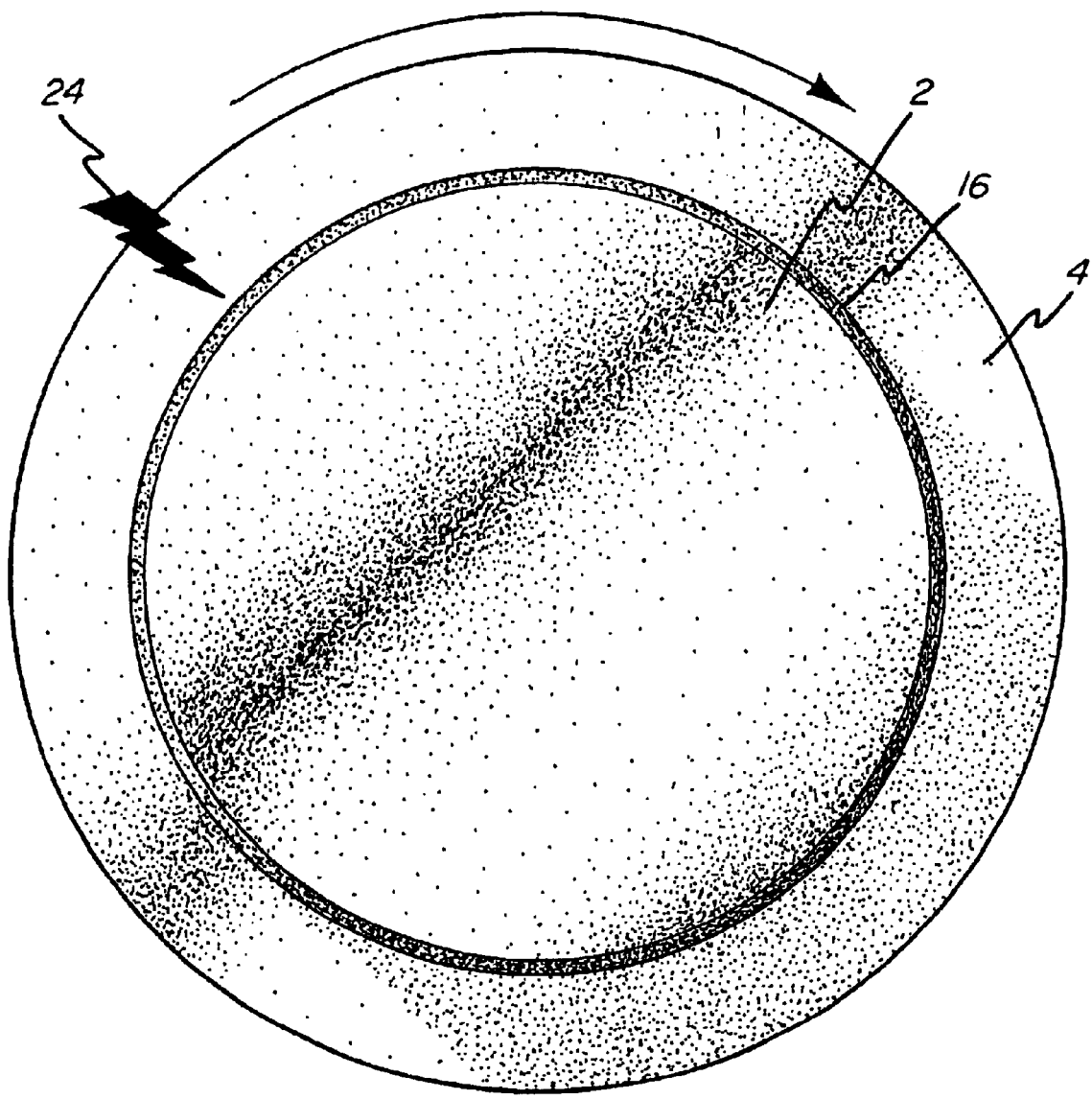
FIG. 6 is a schematic top view of a target/backing plate assembly of the invention.

FIG. 6 shows one assembly during formation of the bead. Here, a shim 16, in the form of a solder strand or rope, is provided around the interfacial target/backing plate joint. The superposed assembly is rotated during e-beam welding so as to hermetically seal the target/backing plate joint.

In accordance with the invention, we have found that many materials in addition to copper, aluminum, and molybdenum may be bonded together, with no virtual leak, by use of an indium or tin solder bead. When an additional shim or rope of the solder is provided around the interfacial joint, this should commonly have a diameter of about 20 mils.

In accordance with the instant methods, the interfacial edge portion or boundary between the solder bonded target and backing plate is provided by heating the interfacial edge portion of the assembly to form a molten bead of solder. The molten bead is then moved around the interface and is disposed in covering relation to the interfacial edge portion.

Ideally, the melting is accomplished via an e-beam welding mechanism which operates in a vacuum. Additionally, other melting techniques such as inert gas welding, e.g., TIG welding, with a high melting point electrode maybe mentioned. Also, the interfacial edge portion of the bead could be melted via use of a laser beam.

Exemplary solder materials comprise mixtures of tin and solutes that may form near eutectic compositions, In these cases, the solute for the solder is chosen from the group consisting of copper, silver, aluminum, magnesium, gold and nickel. Also, an essentially pure tin solder maybe mentioned.

Additionally, indium solders can be utilized or a tin based solder can be used that is alloyed with an alloying element selected from the group consisting of antimony, bismuth, indium, gallium and mixtures of those alloying elements.

In some instances, it is advisable to provide a protective layer of nickel or nickel alloy, for example Ni7V nickel alloy, on the target and/or on the backing plate prior to formation of the initial solder bonded joint.

While the forms of the methods and assembly herein described constitute preferred embodiments of this invention, it is to be understood that the invention is not limited to these precise forms, and that changes may be made therein without departing from the scope of the invention which is defined in the appended claims.

What is claimed is:

1. Method of sealing an edge of a solder bonded target assembly having a target and backing plate, the method comprising heating the edge of the solder locally thereby forming a solder base and rotating the assembly to move a the molten bead continuously around the assembly a full 360°.

2. Method as recited in claim 1 further comprising holding the assembly in a vacuum.

3. Method as recited in claim 1 further comprising building a solder reservoir into the backing plate or target by developing a groove by machining or mechanical means, the reservoir being thicker than an average bond line thickness by 2× to 10×, the groove being built into a part of the assembly which will be on a lower half during sealing.

4. Method as recited in claim 3 wherein the assembly is sealed in an inverted position.

5. Method as recited in claim 1 wherein a solder shim is used to feed excess solder for making a seal.

6. Method as recited in claim 1 wherein the heating is by electron beam.

7. Method as recited in claim 1 wherein the heating is by laser beam.

8. Method as recited in claim 1 wherein the heating is by inert gas weld with a high melting point electrode.

9. Method as recited in claim 8 wherein said inert gas weld is a TIG weld.

10. Method as recited in claim 1 wherein the solder is a mixture of tin and a solute near the eutectic composition and wherein the solute is copper, silver, aluminum, magnesium, gold, or nickel.

11. Method as recited in claim 1 wherein the solder is tin.

12. Method as recited in claim 1 wherein the solder is indium.

13. Method as recited in claim 1 wherein the solder is tin alloyed with antimony, bismuth, indium, or gallium or combinations thereof.

14. Method as recited in claim 1 wherein the target and/or backing plate are first coated with a protective layer of nickel or nickel alloy before the solder bonding step.

15. Method as recited in claim 14 wherein the nickel or nickel alloy is Ni7V nickel alloy.

16. Method as recited in claim 3 further comprising providing more than one concentric groove for the purpose of trapping voids.

17. Method of sealing an edge of solder bonded target assembly having a target and a backing plate, said method comprising forming a solder reservoir around said assembly by developing a groove in said target or backing plate for reception of solder therein, and heating said solder, thereby forming a solder base and a molten bead around said assemble, whereby said solder reservoir traps any edge voids contained within said solder base.

* * * * *